United States Patent
Tseng

[11] Patent Number: 5,933,741
[45] Date of Patent: Aug. 3, 1999

[54] METHOD OF MAKING TITANIUM SILICIDE SOURCE/DRAINS AND TUNGSTEN SILICIDE GATE ELECTRODES FOR FIELD EFFECT TRANSISTORS

[75] Inventor: Horng-Huei Tseng, Hsinchu, Taiwan

[73] Assignee: Vanguard International Semiconductor Corporation, Hsin-Chu, Taiwan

[21] Appl. No.: 08/912,534

[22] Filed: Aug. 18, 1997

[51] Int. Cl.[6] ............................................. H01L 21/336
[52] U.S. Cl. .................................... 438/305; 438/655
[58] Field of Search ............................... 438/303, 305, 438/306, 307, 655, 656, 657

[56] References Cited

U.S. PATENT DOCUMENTS

| | | | |
|---|---|---|---|
| 4,690,730 | 9/1987 | Tang et al. ............................. | 156/643 |
| 5,352,631 | 10/1994 | Sitaram et al. ........................ | 437/200 |
| 5,468,662 | 11/1995 | Havemann ............................ | 437/40 |
| 5,491,099 | 2/1996 | Hsu ....................................... | 437/35 |
| 5,512,502 | 4/1996 | Ootsuka et al. ....................... | 438/305 |
| 5,554,549 | 9/1996 | Huang .................................. | 438/305 |
| 5,639,678 | 6/1997 | Lee et al. .............................. | 438/655 |

*Primary Examiner*—Chandra Chaudhari
*Attorney, Agent, or Firm*—George O. Saile; Stephen B. Ackerman

[57] ABSTRACT

A method for making low sheet resistance gate electrodes and low contact resistance source/drain areas on FETs has been achieved. The method involves patterning on a silicon substrate FET gate electrodes from polysilicon and a silicon-rich tungsten silicide ($WSi_x$) layer, where x is about 2.5. FET Lightly Doped source/Drain (LDD) areas are formed adjacent to the gate electrodes. Then sidewall spacers are formed on the gate electrodes. The substrate is then thermally oxidized to form a cap oxide ($SiO_2$) on the $WSi_x$ gate electrodes that is thicker than the silicon oxide grown concurrently on the source/drain areas. The thinner oxide is etched off the source/drain areas while a portion of the thicker cap oxide is retained on the gate electrodes. Titanium (Ti) is deposited and annealed to form $TiSi_2$ source/drain areas, and the unreacted Ti is selectively removed on the cap oxide over the $WSi_2$. Heavily doped source/drain junctions are formed by ion implanting through the $TiSi_2$ to complete the FETs. This method provide FETs with gate electrodes having low sheet resistance and shallow diffused source/drain junctions with low contact resistance, thereby improving circuit performance. The invention also eliminates the silicide bridging problem associated with the conventional salicide process.

24 Claims, 3 Drawing Sheets

METHOD OF MAKING TITANIUM SILICIDE SOURCE/DRAINS AND TUNGSTEN SILICIDE GATE ELECTRODES FOR FIELD EFFECT TRANSISTORS

BACKGROUND OF THE INVENTION

(1) Field of the Invention

The present invention relates to the fabrication of integrated circuit devices on semiconductor substrates, and more particularly relates to a method for making field effect transistors (FETs) having titanium silicide source/drain areas and tungsten silicide FET gate electrodes that reduce the source/drain and gate electrode resistance and improve device performance.

(2) Description of the Prior Art

Field effect transistors (FETs) are used in the semiconductor industry for Ultra Large Scale Integration (ULSI) circuits. The FETs are formed using patterned conductively doped polysilicon layers for the gate electrodes and diffused self-aligned doped areas in the substrate adjacent to the gate electrodes for the source/drain areas. The polysilicon layers and the source/drain areas, even though conductively doped, have more electrical resistance than metal or metal silicide layers. This higher resistance is generally undesirable because it increases the RC (resistance×capacitance) time delay of the circuit and reduces circuit performance (speed). Therefore, metal silicides are commonly used on the gate electrodes and on the source/drain areas to improve the performance.

One conventional method of forming the FETs with silicide gate electrodes and source/drain areas is to form the gate electrodes by patterning a multilayer of doped polysilicon, a metal silicide, and a cap oxide layer over the gate oxide on the device areas. The gate electrodes are then used as a diffusion or implant barrier mask to form self-aligned lightly doped source/drain areas in the substrate adjacent to the sides of the gate electrodes. Sidewall insulating spacers are formed on the gate electrode sidewalls and a second implant, aligned to the sidewall spacers, is used to form the source/drain contact areas. A metal is deposited and annealed (sintered) to form the silicide source/drain contact areas with low resistance. However, this requires additional etching steps to form the gate electrodes in the multilayer of oxide, silicide, and polysilicon, which also requires reasonably vertical sidewalls for forming the sidewall spacers.

Another method which saves processing steps is the self-aligned silicide (salicide) process in which both the silicide gate electrodes and source/drain areas are made at the same time. In this method the gate electrodes are formed from a single doped polysilicon layer, and after forming insulating sidewall spacers a single metal, such as titanium (Ti), is deposited and annealed to concurrently form the silicide source/drain areas and silicide gate electrodes. The unreacted Ti on the oxide sidewall spacers and on other oxide surfaces is removed to electrically isolate the silicide source/drains areas from the silicide gate electrodes. However, during annealing the silicon can diffuse in the metal on the sidewall spacers that is not easily removed. This results in unwanted electrical shorts between source/drain and gate electrodes.

Numerous methods have been described for making FETs with silicide gate electrodes and source/drains. For example, in U.S. Pat. No. 5,468,662, Havemann teaches a method for making thin film transistors (TFTs) and FETs with silicide source/drains and gate electrodes. Havemann uses the salicide process and therefore would be prone to source/drain-to-gate-electrode shorts. Another approach for making silicided FETs is described by Sitaram et al. in U.S. Pat. No. 5,352,631. Sitaram first forms a doped polysilicon gate electrode with a cap oxide layer and insulating sidewall spacers. A first metal is deposited and annealed to form the silicide source/drains. The cap oxide on the gate electrode is selectively removed, and a second metal is deposited and annealed to form the silicide gate electrodes. The method is intended to provide different silicides for the source/drain and gate electrodes, each having the best processing and electrical characteristics, but does not treat the shorting problem between source/drain and gate electrode. T. E. Tang et al., in U.S. Pat. No. 4,690,730, utilizes a cap oxide layer on top of a single titanium layer prior to annealing to avoid oxygen contamination and suppresses silicon outdiffusion through portions of the metal layer (titanium) during annealing to form the silicide source/drain areas and gate electrodes. Another invention, Hsu, U.S. Pat. No. 5,491,099 uses the conventional salicide process to form $TiSi_2$ source/drain areas and gate electrodes. A selective etch is used to remove the sidewall spacers and trenches are etched in the silicon substrate in the sidewall spacer area. An angled ion implant is used to form lightly doped drains (LDDs). The trenches are then filled with an oxide to isolate the silicide source/drain areas from the silicide gate electrodes. However, it is necessary to control accurately the trench etch depth, and to avoid plasma etch damage.

However, there is still a need in the semi-conductor industry to make FETs with different metal silicides on the source/drains and gate electrodes while avoiding the need to pattern a multilayer of cap oxide/polysilicon to form the gate electrodes. And there is still a need to provide an FET process that avoids the electrical shorting problem associated with the salicide process.

SUMMARY OF THE INVENTION

It is therefore a principal object of this invention to form field effect transistors having self-aligned metal silicide source/drains and tungsten silicide gate electrodes that reduce the source/drain and gate resistance thereby improving device performance.

It is another object of this invention to provide a process for making self-aligned silicide source/drains and gates that avoids the conventional salicide process which is prone to source/drain-to-gate electrical shorts.

It is still another object of the invention to provide a cost-effective manufacturing process while improving device performance.

In accordance with the objects of the invention, a method for fabricating improved field effect transistors (FETs) having self-aligned metal silicide source/drain areas to tungsten silicide gate electrodes is described. This method provides low resistance source/drains and gates for improved device performance while avoiding source/drain-to-gate bridging which causes electrical shorts that commonly occur in the more conventional salicide processes.

The objectives previously mentioned are achieved by providing a semiconductor substrate, such as a single-crystal silicon doped with a P-type dopant, such as boron. Field OXide (FOX) regions are formed in and on the substrate to surround and electrically isolate device areas. Typically the FOX is formed by the LOCal Oxidation of Silicon (LOCOS) method commonly used in the industry, but other more advanced types of isolation, such as shallow trench isolation, can be used. The improved FETs having lower source/drain and gate resistance are fabricated in the device areas. The method includes growing a thermal oxide to form a thin gate oxide on the device areas for the FETs. A conductively doped polysilicon layer is deposited on the substrate using low-pressure chemical vapor deposition (LPCVD) and is in-situ doped with a conductive dopant. Alternatively the polysilicon layer can be doped by ion implantation to form both N- and P-channel FETs. A silicon-rich tungsten silicide layer is deposited on the polysilicon layer to reduce the gate electrode sheet resistance. The tungsten silicide layer and the doped polysilicon layer are patterned using a photoresist mask and anisotropic etching leaving portions over the device areas to form gate electrodes. After removing the photoresist mask, lightly doped source/drain areas are formed adjacent to the gate electrodes by ion implantation. A conformal insulating layer, such as silicon oxide or silicon oxide/silicon nitride ($SiO_2/Si_3N_4$), is deposited over the gate electrodes and on the substrate, and anisotropically etched back to form sidewall spacers on the gate electrodes. Now the substrate is thermally oxidized to form a thick oxide on the silicon-rich tungsten silicide gate electrodes and concurrently grows a thinner silicon oxide on the lightly doped source/drain areas in the single-crystal silicon substrate. A key feature of this invention is to completely remove by plasma etching the thinner silicon oxide on the lightly doped source/drain areas, while retaining a portion of the thicker oxide on the tungsten silicide gate electrodes. Next, self-aligned metal silicide source/drain areas are formed by depositing a blanket metal layer and annealing the substrate to form the metal silicide on the source/drain areas, while leaving the unreacted metal on insulated surfaces of the substrate. Preferably the metal layer is composed of titanium (Ti). The unreacted metal areas include the metal over the silicon oxide on the gate electrodes. The unreacted metal is selectively removed from the substrate. The formation of the silicide source/drain areas and the separate formation of the tungsten silicide gate electrodes prevents the formation of electrical shorts between the source/drain and the gate electrode that is prevalent in the conventional salicide process, which forms both silicides at the same time.

Now, to complete the formation of the FETs, an ion implantation is used to form the heavily doped source/drain areas underneath the metal silicide adjacent to the sidewall spacers. The integrated circuit process can now be continued by depositing an interlayer dielectric (ILD) on the FETs to electrically insulate the FETs from the next level of interconnections. Conventional photolithographic techniques are used to form contact holes in the ILD layer to the underlying devices on the substrate. An electrically conductive layer, such as a doped polysilicon/silicide or a metal such as aluminum or aluminum/copper alloy, is deposited and patterned to form the next level of metal interconnections. If aluminum is used, it is common practice in the semiconductor industry to include a barrier layer, such as titanium/titanium nitride, prior to depositing the aluminum to prevent spiking (Al penetration) in the shallow diffused junctions formed on the substrate.

BRIEF DESCRIPTION OF THE DRAWINGS

The objects and other advantages of the invention are best understood with reference to the embodiment and in conjunction with the following drawings.

DESCRIPTION OF THE PREFERRED EMBODIMENT

Now in keeping with the objects of this invention, the method for forming improved field effect transistors with low resistance silicide source/drains and gate electrodes is described in detail. The method is described for making N-channel FETs using a patterned tungsten silicide on an in-situ N$^+$ doped polysilicon layer to form the gate electrodes. However, it should be well understood by those skilled in the art that by using additional masking steps and ion implantations that both P- and N-channel FETs having low sheet resistance source/drains and gate electrodes, respectively, can be made on N- and P-doped wells in the substrate, and that complementary metal oxide semiconductor (CMOS) circuits can be formed therefrom.

Figure 1:
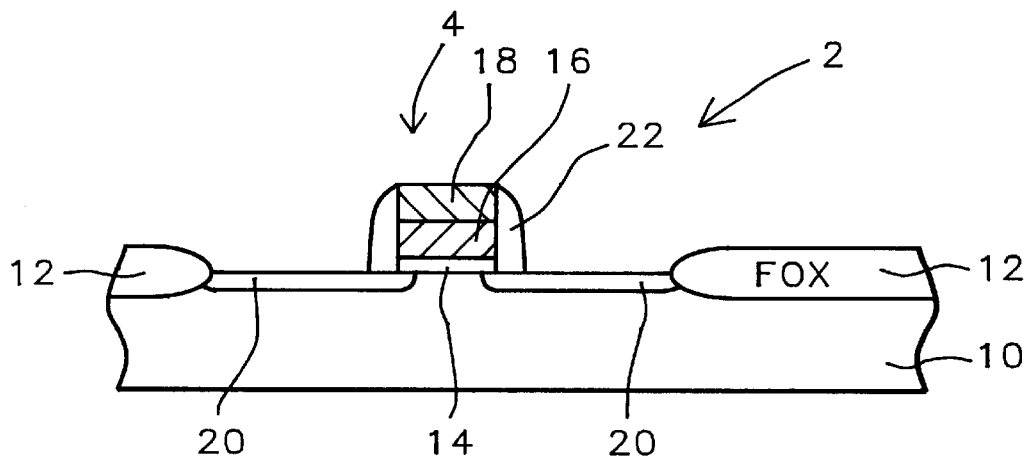
FIGS. 1 through 8 show schematic cross-sectional views of a field effect transistor for the sequence of processing steps for making the self-aligned metal silicide source/drains and silicide gate electrodes having low sheet resistance.

Referring now to FIG. 1, a cross-sectional view of a substrate 10 having a partially completed N-channel field effect transistor formed on and in the substrate surface is schematically shown. The preferred substrate is composed of a P-type single-crystal silicon having a <100> crystallographic orientation. A Field OXide (FOX) isolation region 12 is formed, typically by the LOCal Oxidation of Silicon (LOCOS) method. The process of forming the LOCOS isolation is not shown in detail, but generally consists of growing or depositing a stress-release pad oxide layer on the substrate, and depositing an oxidation barrier layer such as silicon nitride ($Si_3N_4$). The $Si_3N_4$ is then patterned having openings over the substrate where the FOX is desired. The substrate is then thermally oxidized to form the FOX having a thickness of between about 3000 and 7000 Angstroms surrounding and electrically isolating device areas 2. The improved FETs with low resistance source/drains and gate electrodes can also be fabricated on substrates having alternative FOX isolations, such as shallow trench isolation (STI) regions and the like.

Still referring to FIG. 1, the FETs are now formed in the active device areas 2 by first thermally oxidizing the device regions to form a thin gate oxide 14. The preferred thickness of the gate oxide 14 is between about 50 and 200 Angstroms.

Still referring to FIG. 1, a conductively doped polysilicon layer 16 is deposited on the substrate using low-pressure chemical vapor deposition (LPCVD) and is insitu doped with a conductive dopant. Layer 16 is deposited by LPCVD using a reactant gas such as silane ($SiH_4$). For an N-channel FET, the polysilicon is doped with arsenic (As) or with phosphorus (P), and is doped to a preferred concentration of between about 1.0 E 19 and 1.0 E 21 atoms/cm$^3$. For example, layer 16 can be doped by adding a reactant gas such as arsine ($AsH_3$) or phosphine ($PH_3$) to the silane ($SiH_4$) during deposition. The polysilicon layer 16 is deposited to a preferred thickness of between about 1000 and 3000 Angstroms.

Continuing with the process and an important feature of this invention, a silicon-rich tungsten silicide ($WSi_x$) layer 18 is deposited on the polysilicon layer 16. This reduces the sheet resistance of the gate electrode which is later formed. The silicon-rich $WSi_x$ layer is preferably deposited by LPCVD using a reactant gas mixture of tungsten hexafluoride ($WF_6$) and $SiH_4$. The $WSi_x$ layer 18 can be deposited by physical vapor deposition (PVD). For example, layer 18 can be deposited by sputter deposition using a composite target composed of W and Si, or cosputtered from separate targets. Layer 18 is deposited to a preferred thickness of between about 1000 and 3000 Angstroms.

Referring still to FIG. 1, the tungsten silicide layer 18 and the doped polysilicon layer 16 are patterned using a photoresist mask (not shown) and anisotropic etching to form the gate electrodes 4 over the device areas 2. For example, the gate electrodes 4 (layers 18 and 16) can be patterned using a high-density plasma etcher and an etchant gas that etches selectively to the underlying gate oxide 14, while providing gate electrodes having essentially vertical sidewalls. For example, the preferred etchant gas mixture is chlorine/sulphur hexafluoride/hydrogen bromide ($Cl_2/SF_6/HBr$). The photoresist mask is removed, for example by plasma ashing. Then lightly doped source/drain areas 20 are formed adjacent to the gate electrodes 4 by ion implantation. During the ion implantation, the gate electrodes 4 are used as the self-aligned implant mask. For example, for N-channel FETs, the source/drain areas 20 are doped with an N type dopant such as arsenic or phosphorus and are doped by implanting with $As^{75}$ or $P^{31}$.

Next, a conformal insulating layer, such as silicon oxide or silicon oxide/silicon nitride ($SiO_2/Si_3N_4$), is deposited over the gate electrodes 4 and on the substrate 10, and anisotropically etched back to form sidewall spacers 22 on the gate electrodes. For example, the $SiO_2$ can be deposited by LPCVD using tetraethosiloxane (TEOS) and ozone ($O_3$) as the reactant gases.

Figure 2:
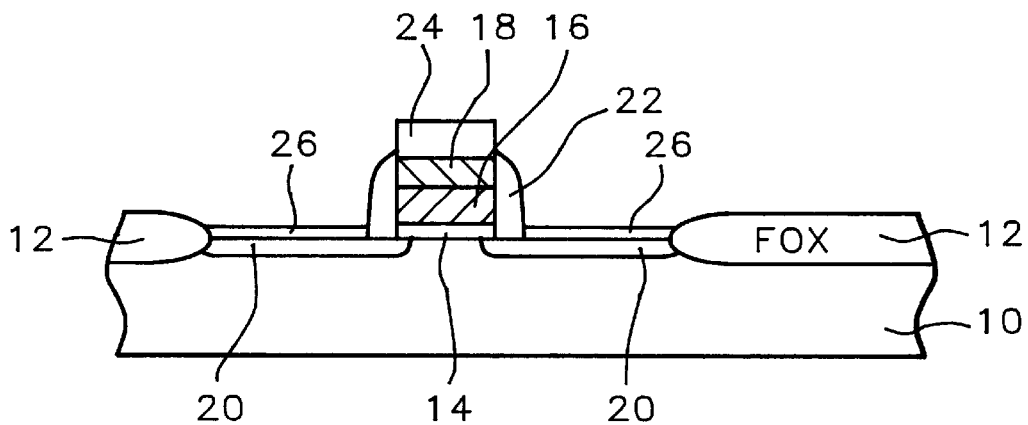

Referring now to FIG. 2, a thermal oxidation is carried out which grows a thick silicon oxide layer 24 on the silicon-rich tungsten silicide 18 on the gate electrodes 4 to form a cap oxide, while concurrently growing a thinner silicon oxide layer 26 on the lightly doped source/drain areas 20. For example, the thermal oxidation grows a thick oxide 24 on a $WSi_{2.5}$ layer that is about 1 to 5 times thicker than the thinner oxide 26 on the source/drain areas 20. The thick oxide on the tungsten silicide layer 18 results from the more rapid oxidation rate of the excess silicon that diffuses to the surface of the tungsten silicide layer. Furthermore, the oxidation of the silicon in the silicon-rich tungsten silicide ($WSi_{2.5}$) layer reduces the silicide layer to a more stoichiometric composition ($WSi_2$). This further reduces the sheet resistance of the tungsten silicide layer 18 while providing a cap oxide 24. Preferably, the thick cap oxide 24 is grown to a thickness of between about 200 and 400 Angstroms, while the thinner oxide 26 is grown to a thickness of between about 50 and 150 Angstroms. Preferably the thermal oxidation is carried out in an oxidation furnace using dry oxygen at a temperature in the range of about 700 to 1000° C.

Figure 3:
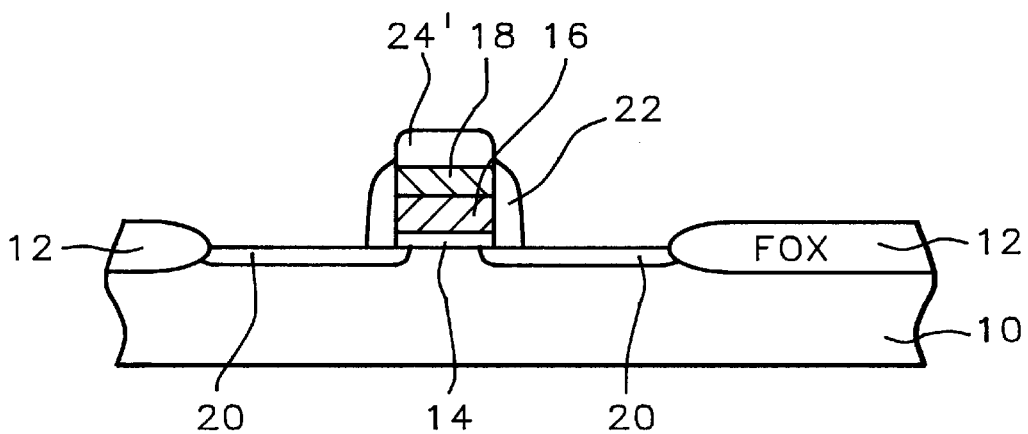

Now referring to FIG. 3, and a key feature of this invention is to completely remove by plasma etching the thinner silicon oxide layer 26 on the source/drain areas 20, exposing the substrate 10 while retaining a portion of the thick cap oxide 24 on the $WSi_{2.5}$ layer 18 of the gate electrodes 4. Layer 26 is removed using a high-density plasma (HDP) etcher and an etchant gas mixture such as carbon tetrafluoride/trifluoromethane/argon ($CF_4/CHF_3/Ar$). The remaining portion of the thick cap oxide 24' on the gate electrodes 4 is between about 100 and 300 Angstroms.

Figure 4:
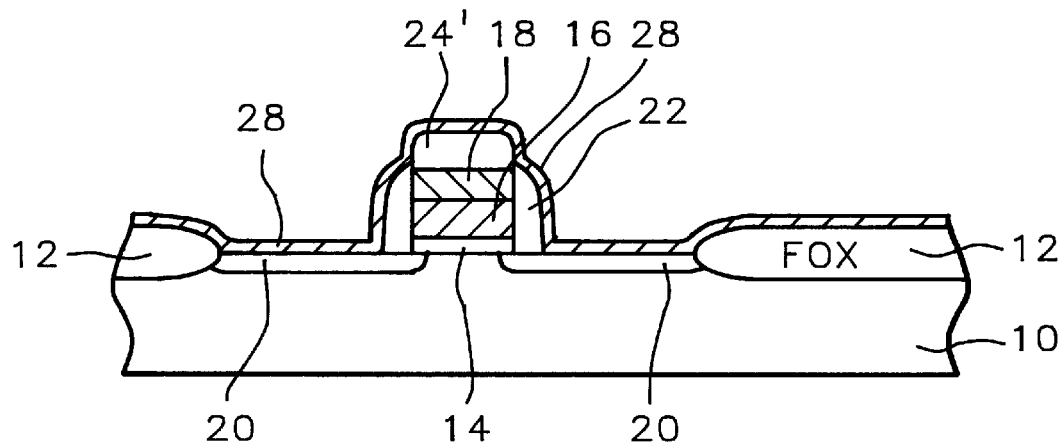

Referring to FIG. 4, a blanket metal layer 28 is deposited and is thermally annealed to form a metal silicide on the source/drain areas 20 self-aligned to the sidewall spacers 22. Preferably, the metal layer 28 is titanium (Ti), and is deposited by sputter deposition to a thickness of between about 100 and 300 Angstroms.

Figure 5:
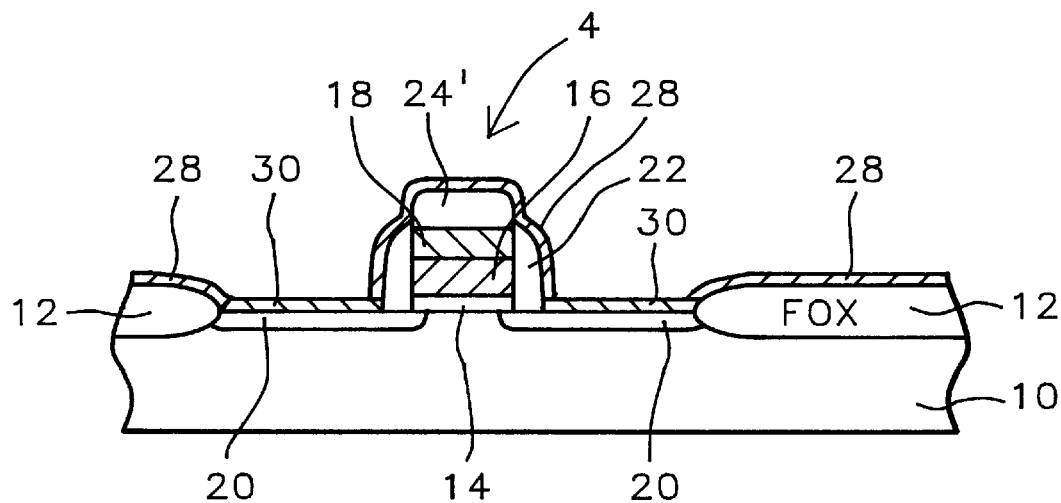

Now as shown in FIG. 5, the Ti layer 28 is annealed to form a titanium silicide 30 on the source/drain areas 20. The sidewall spacers 22 and the cap oxide 24' prevent the Ti from reacting with the gate electrodes 4. Layer 28 is annealed preferably using rapid thermal anneal (RTA) or alternatively can be annealed in a furnace. The anneal is carried out in nitrogen ($N_2$) to avoid forming a titanium oxide. Preferably the annealing is carried out at a temperature of between about 600 and 750° C. which forms the $TiSi_2$ 30 on the source/drain areas 20 while leaving unreacted Ti 28 on the insulated surfaces of the substrate.

Figure 6:
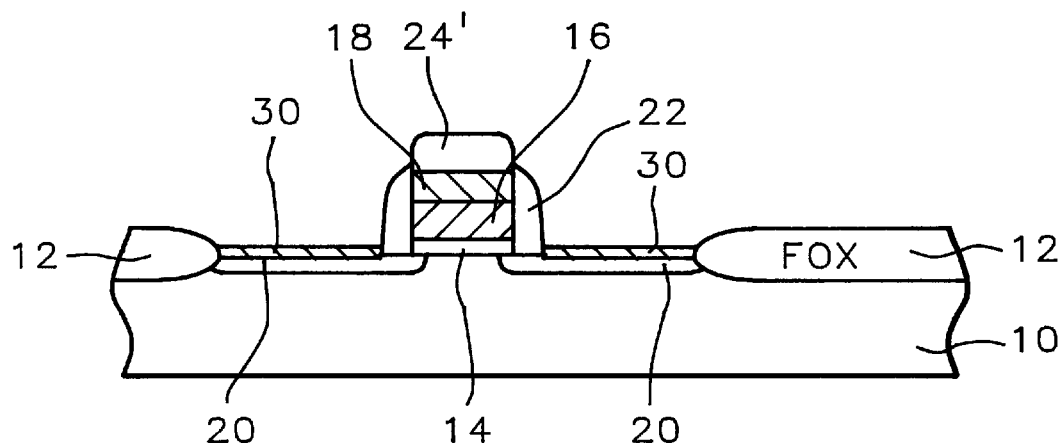

Referring to FIG. 6, the unreacted Ti 28 (shown in FIG. 5) over the insulated surfaces, which includes the area over the $SiO_2$ 24 on the gate electrodes 4, is removed selectively using an aqueous solution of ammonium hydroxide ($NH_4OH$) and hydrogen peroxide ($H_2O_2$). The cap oxide 24 that is grown over the $WSi_x$ 18 serves to prevent electrical shorts between the source/drain and the gate electrode that would otherwise occur using a more conventional salicide process. Although the method is described for $TiSi_2$ source/drain areas, it should be understood that other refractory metals that form silicides, such as tantalum (Ta) can also be used.

Figure 7:
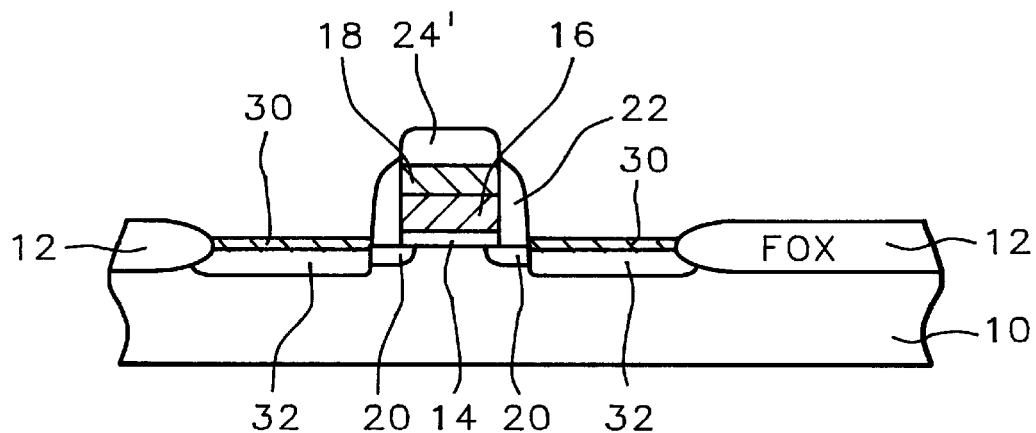

Referring now to FIG. 7, to complete the formation of the FETs, an ion implantation is used to form the heavily doped source/drain areas 32 by implanting through the $TiSi_2$ layer 30 adjacent to the sidewall spacers 22. Preferably for an N-channel FET as shown in FIG. 7, the source/drains are implanted with arsenic ($As^{75}$) or phosphorus ($P^{31}$) ions to form a heavily doped shallow junction. If the implant is $As^{75}$, preferably the ion implant dose is between about 1.0 E 15 and 5.0 E 16 ions/cm$^2$ and the ion implant energy is between about 40 and 120 KeV. Furthermore, to form a P-channel FET in an N-doped well in the substrate, then the heavily doped source/drain areas 32 can be formed by implanting boron ($B^{11}$) or boron difluoride ($BF_2^+$). This completes the formation of the FETs having both a low resistance for the gate electrodes and low contact resistance for the source/ drain areas. Also, the method provides for making shallow junctions. Further, the method of this invention also eliminates the silicide bridging problem common to the Ti salicide process.

Figure 8:
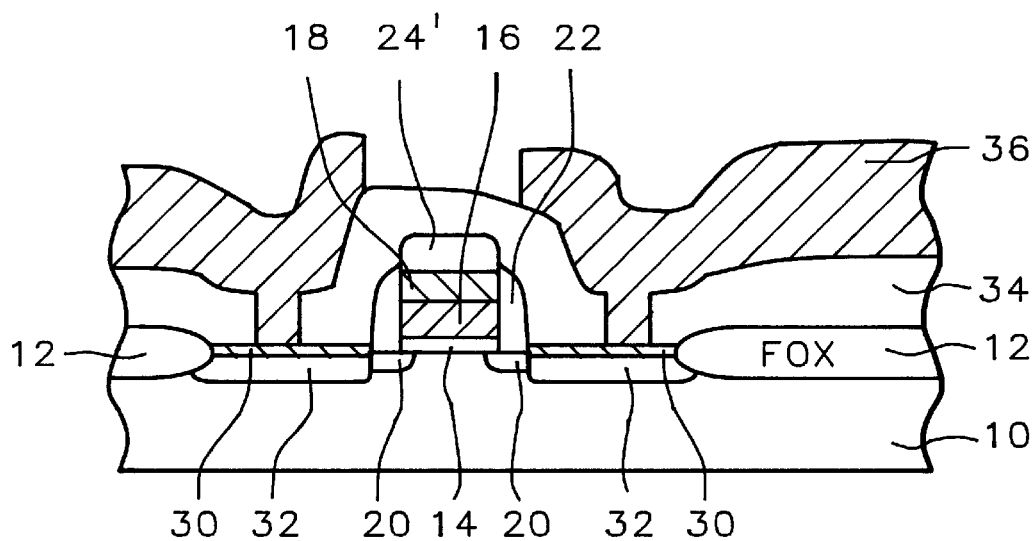

Referring to FIG. 8, the integrated circuits containing these improved FETs are now completed up to the first level of metal interconnections. An interlayer dielectric (ILD) layer 34 is deposited on the substrate and over the FETs to electrically insulate the FETs from the next level of interconnections. Preferably the ILD layer 34 is $SiO_2$ and is deposited by LPCVD to a thickness of between about 3000 and 8000 Angstroms. Layer 34 may be planarized, but is depicted in FIG. 8 as a conformal layer. Conventional photolithographic techniques and plasma etching are used to form contact holes 6 in the ILD layer 34 to the underlying device areas, such as the source/drain device areas 2 on the FETs. An electrically conductive layer 36, such as a doped polysilicon/silicide or a metal such as aluminum or aluminum/copper alloy, is deposited and patterned to form the next level of metal interconnections. Preferably the thickness of layer 36 is between about 3000 and 6000 Angstroms. If aluminum is used, it is common practice in the semiconductor industry to include a barrier layer, such as titanium/titanium nitride, prior to depositing the aluminum to prevent spiking (Al penetration) in the shallow diffused junctions formed on the substrate. Conventional photolithographic techniques and plasma etching are used to pattern layer 36.

While the invention has been particularly shown and described with reference to the preferred embodiment thereof, it will be understood by those skilled in the art that various changes in form and details may be made without departing from the spirit and scope of the invention.

What is claimed is:

1. A method for fabricating field effect transistors (FETs) having low resistance source/drains and gate electrodes comprising the steps of:

providing a semiconductor substrate;

forming field oxide isolation regions surrounding and electrically isolating device areas;

forming a gate oxide on said device areas by thermal oxidation;

depositing a conductively doped polysilicon layer on said substrate;

depositing a silicon rich tungsten silicide layer on said polysilicon layer;

patterning said tungsten silicide layer and said polysilicon layer by photoresist masking and anisotropic etching leaving portions over said device areas to form said gate electrodes;

forming lightly doped source/drain areas adjacent to said gate electrodes by ion implantation;

depositing a conformal insulating layer over said gate electrodes and elsewhere on said substrate;

anisotropically etching back said insulating layer thereby forming sidewall spacers on said gate electrodes;

thermally oxidizing to form a silicon oxide on said tungsten silicide gate electrodes and concurrently growing a thinner silicon oxide on said lightly doped source/drain areas;

removing completely said thinner silicon oxide on said source/drain areas by plasma etching while concurrently retaining a portion of said silicon oxide on said tungsten silicide gate electrodes;

depositing a blanket metal layer and annealing said substrate to form metal silicide on said source/drain areas while leaving unreacted metal on insulated surfaces of said substrate including on said silicon oxide on said gate electrodes;

removing said unreacted metal from said substrate;

forming heavily doped source/drain areas adjacent to said sidewall spacers by ion implantation thereby completing said field effect transistors.

2. The method of claim 1, wherein said conductively doped polysilicon layer is in-situ doped during deposition with arsenic and has a dopant concentration of between about 1.0 E 19 and 1.0 E 21 atoms/cm$^3$.

3. The method of claim 1, wherein said conductively doped polysilicon layer has a thickness of between about 1000 and 3000 Angstroms.

4. The method of claim 1, wherein said silicon rich tungsten silicide layer is deposited by low-pressure chemical vapor deposition (LPCVD) using a reactant gas mixture of tungsten hexafluoride ($WF_6$) and silane ($SiH_4$).

5. The method of claim 1, wherein said silicon-rich tungsten silicide has an atomic ratio of silicon to tungsten of greater than 2.5:1.0.

6. The method of claim 1, wherein said tungsten silicide layer has a thickness of between about 1000 and 3000 Angstroms.

7. The method of claim 1, wherein said lightly doped source/drain areas are doped with arsenic.

8. The method of claim 1, wherein said thermal oxidation forms said silicon oxide to a thickness of between about 200 and 400 Angstroms on said tungsten silicide layer, and concurrently said thermal oxidation forms said thinner silicon oxide on said lightly doped source/drain areas to a thickness of between about 50 and 150 Angstroms.

9. The method of claim 1, wherein during said removal of said thinner silicon oxide from said source/drain areas, said silicon oxide remaining on said tungsten silicide gate electrodes after said plasma etching is between about 100 and 300 Angstroms thick.

10. The method of claim 1, wherein said metal layer is titanium deposited by sputter deposition to a thickness of between about 100 and 300 Angstroms.

11. The method of claim 10, wherein said titanium silicide is annealed at a temperature of between about 600 and 750° C.

12. The method of claim 1, wherein said heavily doped source/drain areas are doped by arsenic ($As^{75}$) ion implantation at a dose of between about 1.0 E 15 and 5.0 E 16 atoms/cm$^2$ and an ion implant energy of between about 40 and 120 KeV.

13. A method for fabricating field effect transistors (FETS) having low resistance source/drains and gate electrodes and having electrical contacts comprising the steps of:

providing a semiconductor substrate;

forming field oxide isolation regions surrounding and electrically isolating device areas;

forming a gate oxide on said device areas by thermal oxidation;

depositing a conductively doped polysilicon layer on said substrate;

depositing on said polysilicon layer a silicon-rich tungsten silicide layer having an atomic ratio of silicon to tungsten of greater than 2.5:1.0;

patterning said tungsten silicide layer and said polysilicon layer by photoresist masking and anisotropic etching leaving portions over said device areas to form said gate electrodes;

forming lightly doped source/drain areas adjacent to said gate electrodes by ion implantation;

depositing a conformal insulating layer over said gate electrodes and elsewhere on said substrate;

anisotropically etching back said insulating layer thereby forming sidewall spacers on said gate electrodes;

thermally oxidizing to form a silicon oxide on said tungsten silicide gate electrodes and concurrently growing a thinner silicon oxide on said lightly doped source/drain areas;

removing completely said thinner silicon oxide on said source/drain areas by plasma etching while concurrently retaining a portion of said silicon oxide on said tungsten silicide gate electrodes;

depositing a blanket titanium layer and annealing said substrate to form titanium silicide on said source/drain areas while leaving unreacted titanium on insulated surfaces of said substrate including on said silicon oxide on said gate electrodes;

removing said unreacted titanium from said substrate;

forming heavily doped source/drain areas adjacent to said sidewall spacers by ion implantation and thereby forming said field effect transistors;

depositing a dielectric layer to insulate said field effect transistors in said device areas;

etching contact holes in said dielectric layer to said source/drain areas and said gate electrodes;

depositing and patterning an electrically conductive layer and thereby completing said field effect transistors having said electrical contacts.

14. The method of claim 13, wherein said conductively doped polysilicon layer is in-situ doped during deposition with arsenic and has a dopant concentration of between about 1.0 E 19 and 1.0 E 21 atoms/cm$^3$.

15. The method of claim 13, wherein said conductively doped polysilicon layer has a thickness of between about 1000 and 3000 Angstroms.

16. The method of claim 13, wherein said silicon rich tungsten silicide layer is deposited by low-pressure chemical vapor deposition (LPCVD) using a reactant gas of tungsten hexafluoride ($WF_6$) and silane ($SiH_4$).

17. The method of claim 13, wherein said tungsten silicide layer has a thickness of between about 1000 and 3000 Angstroms.

18. The method of claim 13, wherein said lightly doped source/drain areas are doped with arsenic.

19. The method of claim 13, wherein said thermal oxidation forms said silicon oxide to a thickness of between about 200 and 400 Angstroms on said tungsten silicide layer, and concurrently said thermal oxidation forms said thinner silicon oxide on said lightly doped source/drain areas to a thickness of between about 50 and 150 Angstroms.

20. The method of claim 13, wherein during said removal of said thinner silicon oxide from said source/drain areas, said silicon oxide remaining on said tungsten silicide gate electrodes after said plasma etching is between about 100 and 300 Angstroms thick.

21. The method of claim 13, wherein said titanium layer is deposited by sputter deposition to a thickness of between about 100 and 300 Angstroms.

22. The method of claim 13, wherein said annealing to form said titanium silicide is carried out at a temperature of between about 600 and 750° C.

23. The method of claim 13, wherein said heavily doped source/drain areas are doped with arsenic ($As^{75}$) by ion implantation at a dose of between about 1.0 E 15 and 5.0 E 16 atoms/cm$^2$ and an ion implant energy of between about 40 and 120 KeV.

24. The method of claim 13, wherein said electrically conductive layer is an aluminum/copper alloy having a titanium/titanium nitride barrier layer.

* * * * *